(12) United States Patent
Porwal et al.

(10) Patent No.: US 12,044,730 B2
(45) Date of Patent: Jul. 23, 2024

(54) DEVICE, SYSTEM, AND METHOD TO CONCURRENTLY STORE MULTIPLE PMON COUNTS IN A SINGLE REGISTER

(71) Applicant: Intel Corporation, Santa Clara, CA (US)

(72) Inventors: Gaurav Porwal, Bangalore (IN); Subhankar Panda, Portland, OR (US); Theodros Yigzaw, Sherwood, OR (US); John Holm, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 690 days.

(21) Appl. No.: 17/131,477

(22) Filed: Dec. 22, 2020

(65) Prior Publication Data

US 2022/0196733 A1 Jun. 23, 2022

(51) Int. Cl.
*G01R 31/28* (2006.01)
*G01R 31/317* (2006.01)

(52) U.S. Cl.
CPC ................... *G01R 31/317* (2013.01)

(58) Field of Classification Search
None
See application file for complete search history.

(56) References Cited

U.S. PATENT DOCUMENTS

| 5,768,152 | A | 6/1998 | Battaline et al. |
| 6,678,777 | B2 | 1/2004 | Rao et al. |
| 7,685,360 | B1 * | 3/2010 | Brunnett ............... G06F 3/0608 |
| | | | 711/112 |
| 7,702,887 | B1 * | 4/2010 | Grohoski ............. G06F 11/3471 |
| | | | 712/227 |
| 7,770,034 | B2 | 8/2010 | Nanja |
| 8,301,868 | B2 * | 10/2012 | Newburn .............. G06F 11/348 |
| | | | 712/220 |

(Continued)

FOREIGN PATENT DOCUMENTS

EP 3719652 10/2020

OTHER PUBLICATIONS

Extended European Search Report from European Patent Application No. 21197633.7 notified Mar. 16, 2022, 8 pgs.

(Continued)

*Primary Examiner* — Mujtaba M Chaudry
(74) *Attorney, Agent, or Firm* — Essential Patents Group, LLP

(57) ABSTRACT

Techniques and mechanisms for providing performance monitoring information. In an embodiment, a performance monitor circuit receives a communication which indicates a format comprising multiple fields which are each to store a respective count of monitored events. A programming of the performance monitor circuit, based on the communication, designates first bits and second bits of the register to provide, respectively, a first first field and a second field according to the format. Performance monitoring subsequent to the programming successively tallies a first count of first events which occur during a first period of time, and a second count of second events which occur during a second period of time. In another embodiment, performance monitoring results in the register concurrently storing both the first count and the second count.

20 Claims, 14 Drawing Sheets

(56) References Cited

U.S. PATENT DOCUMENTS

| | | | |
|---|---|---|---|
| 8,832,505 B2* | 9/2014 | Fryman | G06F 11/0709 717/129 |
| 9,575,766 B2 | 2/2017 | Yasin et al. | |
| 10,025,686 B2 | 7/2018 | Ganguli et al. | |
| 10,409,763 B2* | 9/2019 | Lai | G06F 9/4552 |
| 11,372,972 B2* | 6/2022 | Carlson | G06F 3/062 |
| 2018/0165199 A1* | 6/2018 | Brandt | G06F 12/1009 |
| 2020/0186592 A1 | 6/2020 | Bernat et al. | |

OTHER PUBLICATIONS

Notice of Allowance from European Patent Application No. 21197633.7 notified Oct. 17, 2023, 9 pgs.

* cited by examiner

400

| 63 | 62 | 61 | 60 | 59 | ... | 7 | 6 | ... | 1 | 0 |
|---|---|---|---|---|---|---|---|---|---|---|
| Overall Accumulation Enable | Accumulation Enable ||| Time duration (Cycles) per event count |||| Sub-counter Size (bits) |||

410

| Event Count Register A | Mn-1 | ... | ... | 2n-1 | ... | n | n-1 | ... | 1 | 0 |
|---|---|---|---|---|---|---|---|---|---|---|
| | Sub-counter M ||| ... || Sub-counter 2 || Sub-counter 1 |||

420

| Event Count Register X | 63 | 62 | 61 | 60 | 59 | ... | 1 | 0 |
|---|---|---|---|---|---|---|---|---|
| | Accumulation counter for events tallied by Register A ||||||||

430

| Bit-field Name | Bits | Description | Example Details |
|---|---|---|---|
| Sub-counter size (in bits) | 6:0 | Divides counter into sub-counter fields | 0 → 1b counters, 1 → 2b counters, 2 → 3b counters,..., 31 → 32b counters, etc. |
| Time slice (clock cycles) per sub-counter | 59:7 | Length of time to tally one count | 1 → per clock cycle, t → t clock cycle |
| Accumulation counter enable | 62:60 | To provide counter-specific enable/disable | '001' to enable counter A |
| Overall accumulation enable | 63 | To enable/disable all count tallying | x00 |

FIG. 4

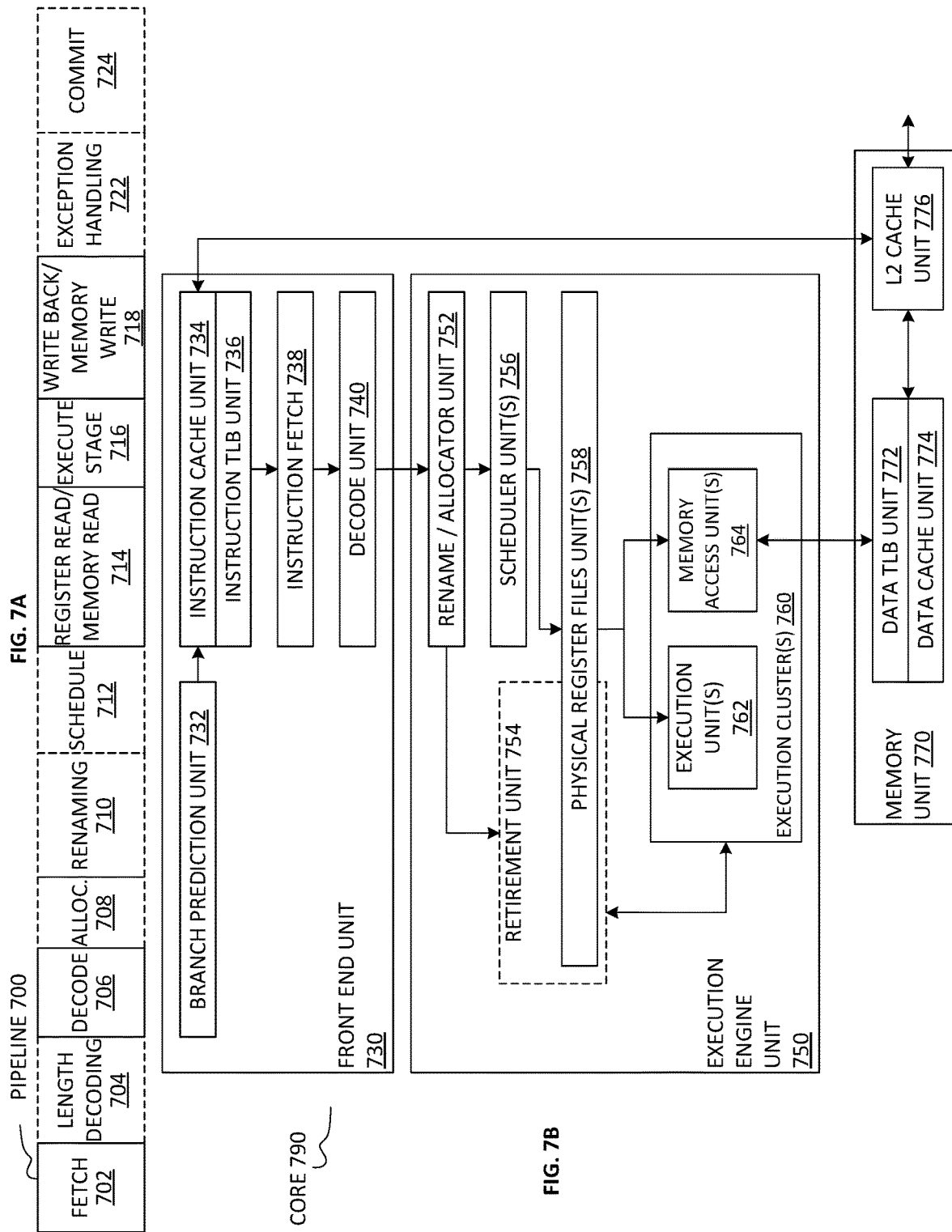

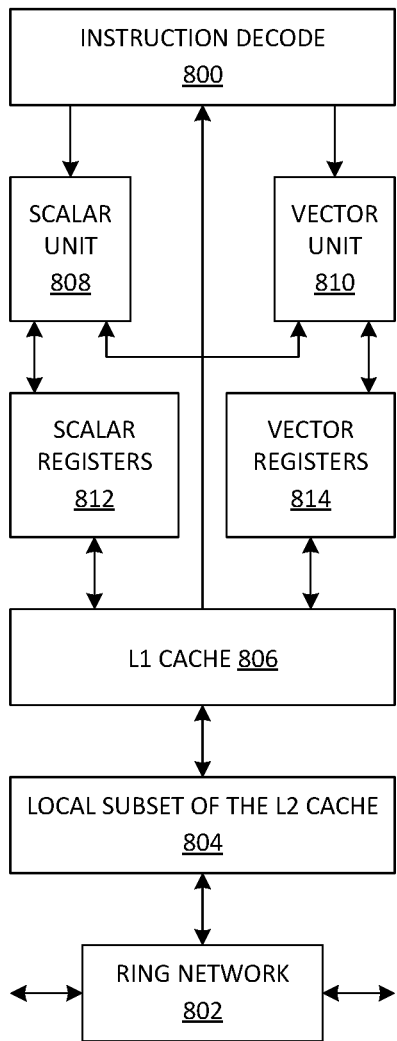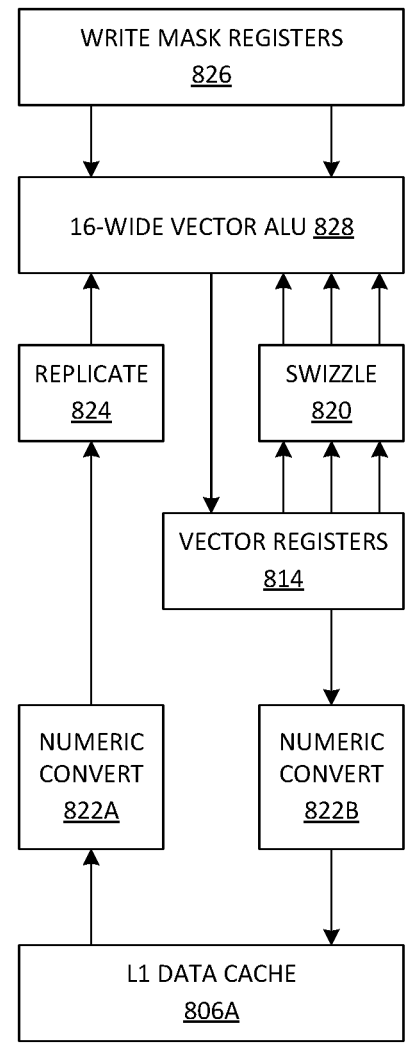
FIG. 8A
FIG. 8B

DEVICE, SYSTEM, AND METHOD TO CONCURRENTLY STORE MULTIPLE PMON COUNTS IN A SINGLE REGISTER

BACKGROUND

1. Technical Field

This disclosure generally relates to techniques for monitoring the performance of digital integrated circuit electronics and more particularly, but not exclusively, to configuring a single register to concurrently store multiple event count values.

2. Background Art

Historically, computer applications have been run on mainframes, single compute nodes such as a single computer, server, or (less frequently) small clusters of computers. In recent years, applications have increasingly become distributed, with scale-out (i.e., using multiple servers to execute a single application) emerging as a means to achieve greater compute performance. This growing trend introduces gaps in performance monitoring (PMON) when compared to existing compute node execution.

Typically, performance monitoring is based on the use of counters to track the instances of events of various event types. PMON architectures, which have changed relatively little in past several years, face increasingly significant challenges in the data era of computing. In many instances, the collection of event count information (particularly across various interfaces) requires in-band software intervention to halt, and subsequently resume, execution of a program. Virtualized environments and cloud computing use cases are just two technologies which are sensitive to PMON-based interruptions to software execution.

Furthermore, problems of scalability are posed by the need for software to have read and write access to PMON mode set registers (MSRs). Further still, PMON is often complicated by the need for local clock counting, at each of multiple functional modules, to facilitate normalization and/or comparison of different types of event telemetry. As software technologies (and underlying hardware in support thereof) continue to continue to grow in capability and diversity, there is expected to be an increasing premium placed on improvements to PMON solutions.

BRIEF DESCRIPTION OF THE DRAWINGS

The various embodiments of the present invention are illustrated by way of example, and not by way of limitation, in the figures of the accompanying drawings and in which:

FIG. 4 illustrates tables showing information to determine the tracking of event counts with a register according to an embodiment.

FIG. 7A is a block diagram illustrating both an exemplary in-order pipeline and an exemplary register renaming, out-of-order issue/execution pipeline according to embodiments of the invention.

FIG. 7B is a block diagram illustrating both an exemplary embodiment of an in-order architecture core and an exemplary register renaming, out-of-order issue/execution architecture core to be included in a processor according to embodiments of the invention;

FIGS. 8A through 8B illustrate a block diagram of a more specific exemplary in-order core architecture, which core would be one of several logic blocks (including other cores of the same type and/or different types) in a chip;

DETAILED DESCRIPTION

Figure 1:
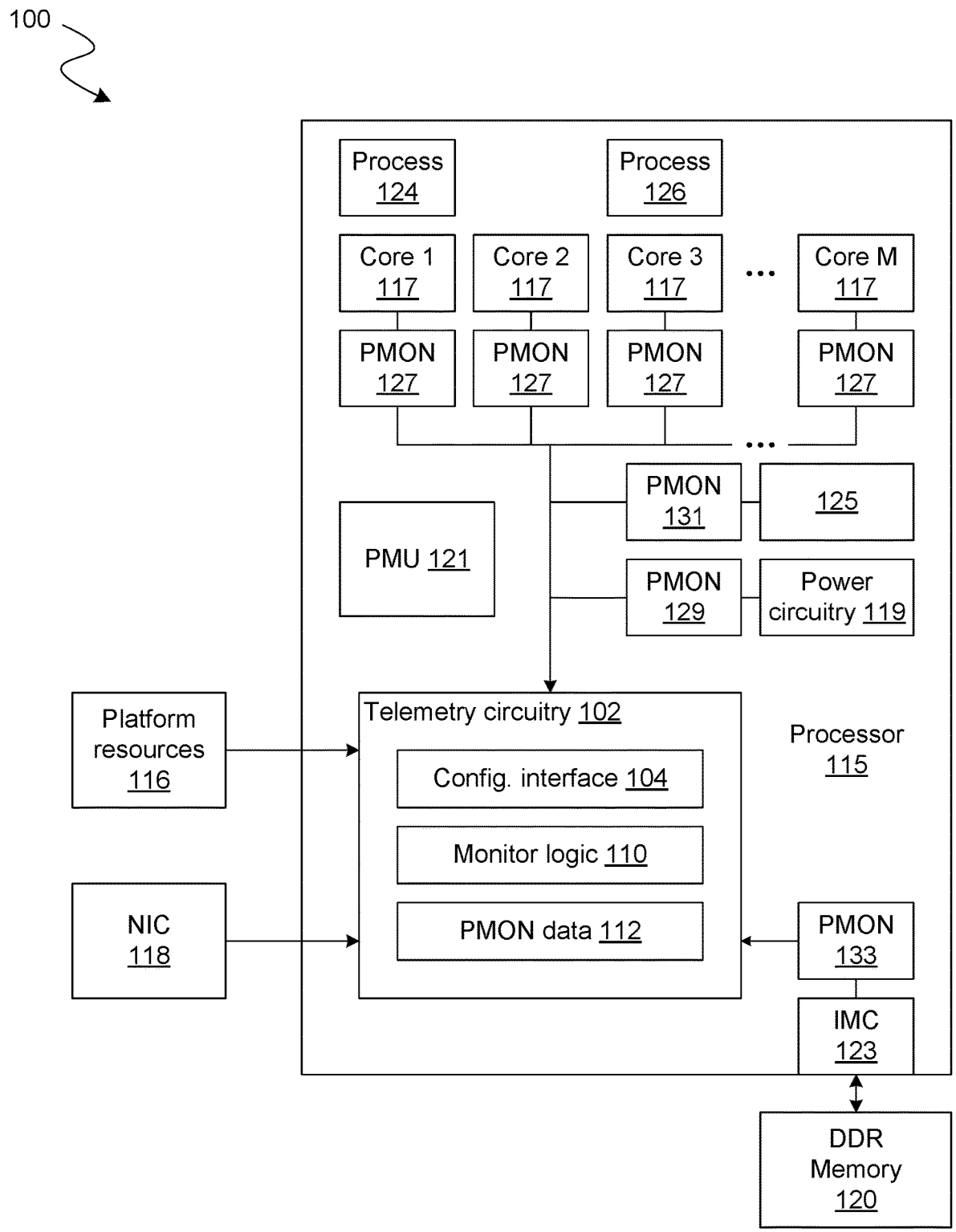
FIG. 1 illustrates a functional block diagram showing features of a device to provide performance monitoring information according to an embodiment.

Embodiments discussed herein variously provide techniques and mechanisms for providing performance monitoring information. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry to provide a register with multiple count values.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Certain features of various embodiments are described herein with reference to performance monitoring which determines a count of events which are each of a same event type. As used herein, "event count" (or, for brevity, simply "count") refers to a counted number of events which, for example, have been detected as occurring each during a corresponding period of time. The value of a given event count—referred to as an "event count value" or, for brevity, a "count value" is subject to being updated at least until an expiration of a period of time for which event count is being tallied (that is, counted). Such an event count is stored to a type of register which is referred to herein as an "event count register" (or, for brevity, a "count register"). In various embodiments, event count information is to be stored at a count register according to a format which is (re)programmable by the provisioning of configuration state—e.g., at another type of register referred to herein as a "configuration register." Such configuration state specifies or otherwise indicates (for example) a number of fields to be provided with a given count register—e.g., wherein circuitry in one such embodiment is (re)configured to concurrently store multiple event counts each in a different respective field of the same count register.

In facilitating the programmability of performance monitor circuitry—the programmability to determine a format of fields for concurrently storing multiple event counts at a single register—some embodiments variously eliminate or otherwise mitigate the need to halt, and subsequently resume, an execution of software so that event counts can be retrieved. Furthermore, in facilitating the programming of a deterministic length of time for count events to be variously tallied, various ones of such embodiments additionally or alternatively eliminate or otherwise mitigate the need to count clock cycles concurrent with the tallying of an event count.

FIG. 1 shows features of a device 100 to provide performance monitoring information according to an embodiment. Device 100 illustrates one example of an embodiment which is operable to define a format according to which various performance monitoring information is to be concurrently stored in an event count register. In one such embodiment, said format includes multiple fields which are store a respective one of event counts which each correspond to a different respective period of time As shown in FIG. 1, device 100 comprises telemetry circuitry 102 comprising one or more configuration interfaces (such as the illustrative configuration interface 104 shown), monitor logic 110, and circuitry to store performance monitoring (PMON) data 112. Telemetry circuitry 102 supports (re)configuration of one or more PMON circuits to determine a format according to which event counts are to be concurrently stored in a single count register.

In the illustrated embodiment of FIG. 1, telemetry circuitry 102 is implemented on each of one or more processors of a platform (e.g., including the illustrative processor 115 shown). In one embodiment, processor 115 is part of a System on Chip architecture which, for example, includes M processor cores 117, such as 4, 6, 8, 12 or more cores. In addition to telemetry circuitry 102, processor 115 also includes some or all of power circuitry 119, a performance monitoring unit (PMU) 121, an integrated memory controller (IMC) 123, and/or other circuitry (collectively depicted by block 125) for which performance monitoring (PMON) data is provided.

Modern processors include various PMON circuits that collect performance monitoring data such as telemetry data and/or tracing data from associated components on the processor. Some embodiments variously provide one or more PMON circuits which are further adapted each to facilitate a concurrent provisioning of multiple count values at a respective register. By way of illustration and not limitation, such one or more PMON circuits include some or all of the illustrative PMON circuits 127 (for respective processor cores 117 of processor 115), and PMON circuits 129, 131, and 133. Processor 115 (or a SOC comprising processor 115) will generally include further components, such as various interconnects, input-output (IO) interfaces, an IO Memory Management Unit (IOMMU), etc., that are not shown for simplicity. The number and configuration of PMON circuits of device 100 is merely illustrative, and not limiting on some embodiments, which variously comprise more, fewer, or differently arranged PMON circuits. Furthermore, some embodiments are not limited with respect to a particular type (or types) of events for which event counting is to be performed by a given PMON circuit.

During operation, telemetry circuitry 102 receives PMON data 112 and other data from (for example) PMON circuits 127, 129, 131, 133, platform resources 116, and a network interface card (NIC) 118. The platform resources include, for example, double data-rate (DDR) random access memory (RAM) (depicted as DDR memory 120). DDR memory 120 includes but is not limited to DDR4 and DDR5 memory. Additionally or alternatively, any of various other types of memory are used, including various types of volatile (e.g., Dynamic RAM (DRAM and Synchronous Dynamic RAM (SDRAM), and non-volatile memory. Memory device form factors include but are not limited to Dual Inline Memory Modules (DIMMs) and Non-Volatile DIMMs (NVDIMMs).

Non-volatile memory is a storage medium that does not require power to maintain the state of data stored by the medium. Non-limiting examples of nonvolatile memory include any or a combination of: solid state memory (such as planar or 3D NAND flash memory or NOR flash memory), 3D crosspoint memory, storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory comprises a transistor-less stackable cross point architecture in which memory cells sit at the intersection of words lines and bit lines and are individually addressable and in which bit storage is based on a change in bulk resistance. In particular embodiments, a memory module with non-volatile memory complies with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org).

Also depicted are processes 124 and 126 which are executing on one or more processor cores 117 (e.g., on Core 1 and Core 3). In one such embodiment, performance monitoring is performed to tally one or more counts each of a respective type of event during execution of one or both of processes 124, 126. By way of illustration and not limitation, a given one of processes 124, 126 facilitates distributed (e.g., cloud-based) software execution, operations in a virtualized execution environment, and/or the like. The illustrated processes 124, 126 are merely exemplary, and it is envisioned that, in some embodiments, upwards of hundreds of processes (for example) are implemented concurrently on a given platform.

Figure 3:
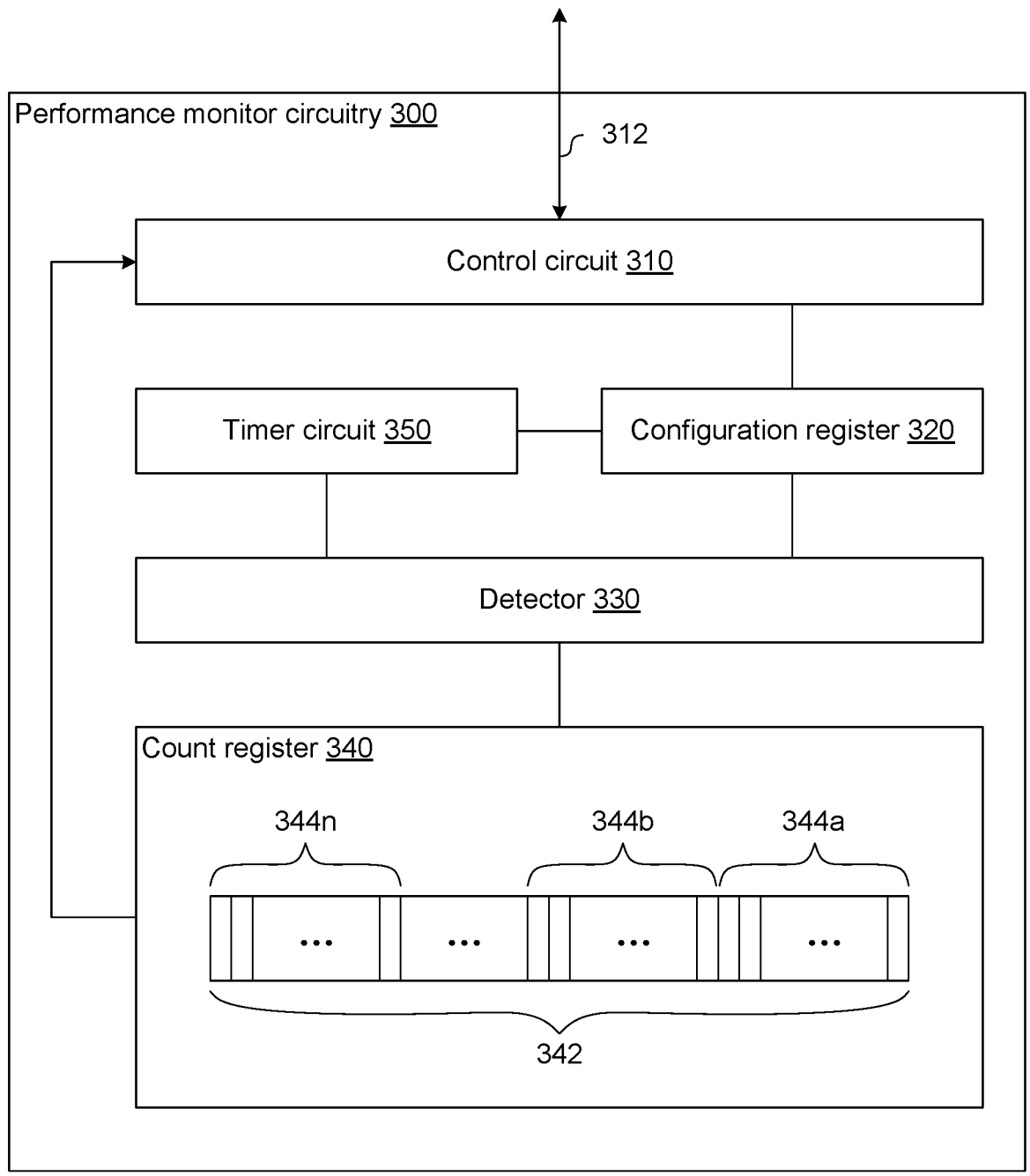
FIG. 3 illustrates a functional block diagram showing features of circuitry to configure event counting with a register according to an embodiment.

A configuration interface 104 of telemetry circuitry 102 supports confirmation of, and access to, a telemetry scheme and performance monitoring data generated according to the telemetry scheme. For example, configuration interface 104 facilitates software and/or other access to a given PMON circuit (e.g., one of PMON circuits 127, 129, 131, 133) which—as illustrated in FIG. 3—comprises a count register, a detector to detect events for which multiple event counts are to be variously tallied, and circuitry which is (re)programmable to determine a format according to which the multiple event counts are to be stored at the count register. Using configuration interface 104, a BOIS process, an OS process or other suitable agent is able to implement a management functionality which programs said PMON circuit with a particular format for registering tallied event counts. In one such embodiment, access to a given PMON circuit via configuration interface 104 is to specify or otherwise indicate one or more parameters including (for example) some or all of:

i. a number of fields for a count register to store respective event counts (and/or a corresponding maximum number of bits of the count register to store any one such event count);

ii. a period of time for tallying a single event count; or iii. an enabled/disabled state of circuitry which is operable to write to, update, or otherwise access a given one or more event count registers.

During operation of device 100, PMON circuits 127, 129, 131, 133 variously operate to tally event counts and/or otherwise generate performance monitoring information—e.g., wherein one or more count registers each store a respective multiple event counts according to programming provided with configuration interface 104. In various embodiments, the contents of a given count register are subsequently provided (for example) to facilitate any of a variety of test, trace, debug and/or other system analysis operations.

For example, telemetry circuitry 102 further comprises or otherwise operates with monitor logic 110 which is coupled to receive receptive event counts and/or other telemetry information from some or all of PMON circuits 127, 129, 131, 133. By way of illustration and not limitation, monitor logic 110 variously requests some or all of PMON circuits 127, 129, 131, 133 each to provide the contents of a respective one or more count registers. Alternatively or in addition, one or more of PMON circuits 127, 129, 131, 133 each push to monitor logic 110 the contents of a respective one or more count registers—e.g., according to a predetermined schedule. Some embodiments do not require the provisioning of event count information to monitor logic 110, or are not otherwise limited to a particular mechanism by which monitor logic 110 receives any such event count information.

In various embodiments, monitor logic 110 is available to forward telemetry data (gathered from one or more PMON circuits) to any of a variety of hardware resources and/or software resources (not shown) which facilitate an evaluation of device 100. By way of illustration and not limitation, configuration interface 104 and/or other logic of telemetry circuitry 102 supports communication with one or more agents—e.g., which reside at, or are to couple to, device 100—that provide functionality adapted (for example) from any of various conventional system test, debug, and/or trace techniques.

In the example embodiment of device 100, a given PMON circuit (e.g., one of PMON circuits 127, 129, 131, 133) comprises a detector to detect events, and a count register to store multiple event counts based on said detected events—e.g., wherein the contents of the count register are subsequently communicated from the PMON to telemetry circuitry 102. Various embodiments additionally or alternatively include a PMON circuit which comprises a detector to detect events, but which omits a count register to store event counts based on said detected events. For example, in one such embodiment, such a PMON circuit instead signals telemetry circuitry 102, during the detecting of events for a given time period, to increment or otherwise update an event count which is being tallied with a count register at telemetry circuitry 102. By way of illustration and not limitation, a count register at telemetry circuitry 102 stores multiple event counts of PMON data 112—e.g., wherein telemetry circuitry 102 is programmed, using communications via configuration interface 104, to provide a multi-field format of said count register.

Figure 2:
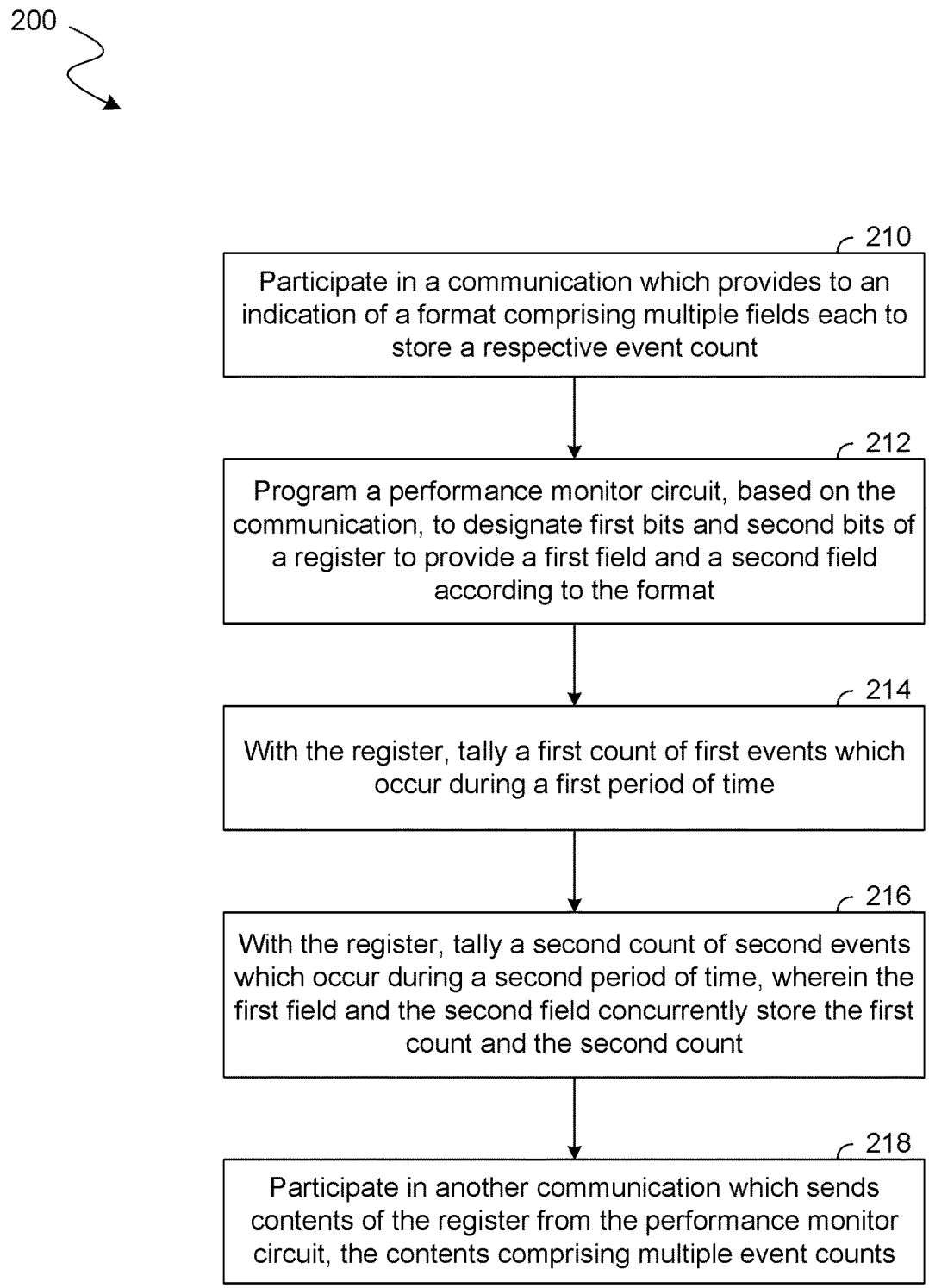
FIG. 2 illustrates a flow diagram showing features of a method to determine performance monitor information with an event count register according to an embodiment.

FIG. 2 illustrates operations of a method 200 to determine how performance monitoring information is to be tallied with an event count register according to an embodiment. Method 200 illustrates one embodiment wherein circuitry is configured (for example, reconfigured) to concurrently store multiple event counts, according to a defined format, each at a different respective field of an event count register. In various embodiments, method 200 is performed with functionality such as that provided by device 100—e.g., with one of PMON circuits 127, 129, 131, 133.

As shown in FIG. 2, method 200 comprises (at 210) participating in a communication which provides to a performance monitor circuit an indication of a format comprising multiple fields each to store a respective event count. For example, the participating at 210 comprises one of PMON circuits 127, 129, 131, 133 receiving configuration information from configuration interface 104 of telemetry circuitry 102.

Method 200 further comprises (at 212) programming the performance monitor circuit based on the communication, wherein said programming is to designate first bits of a count register to provide a first field according to the format. Furthermore, the programming at 212 is to designate second bits of the count register to provide a second field according to the format. By way of illustration and not limitation, the programming at 212 comprises writing to a configuration register of the performance monitor circuit one or more parameters which indicate an event register format. Such one or more more parameters specify or otherwise indicate (for example) a total number of the multiple fields (and/or a corresponding maximum number of bits with which a register is to store any one event count). In one such embodiment, the one or more more parameters further specify or otherwise indicate a duration of time during which a single event count is to be tallied. Additionally or alternatively, one or more more parameters specify or otherwise indicate (for example) whether a particular circuit functionality—e.g., to write to or otherwise update any data of a given one or more event count registers—is to be enabled or disable. In some embodiments, the one or more parameters each determine how multiple event counters of the performance monitor circuit are to be used—e.g., wherein programming the performance monitor circuit at 212 provides, for each of said multiple count registers, respective fields of the count register according to the format.

In some embodiments, the programming at 212 comprises setting a maximum possible value of a count to be tallied with a given field of the count register (e.g., one of the first field or the second field). By way of illustration and not limitation, in one example embodiment, providing a 4-bit field of a count register comprises preventing the count register from exceeding an event count of 15 with that 4-bit field. Similarly, providing an 8-bit field of a count register would prevent the count register from exceeding an event count of 255 with that 8-bit field—e.g., where providing a 16-bit field of a count register would prevent the count register from exceeding an event count of 65,535 with that 16-bit field. In one such embodiment, setting the maximum possible event count value of a field comprises disabling a rollover of said field, e.g., where said rollover would otherwise increment one or more bits of an adjoining field in the count register.

Method 200 further comprises tallying a first count of first events with the count register (at 214), and tallying a second count of second events with the count register (at 216), wherein the first events occur during a first period of time, and the second events occur during a second period of time after the first period of time. Based on the tallying at 214 and 216, the first field and the second field concurrently store the first count and the second count.

In an illustrative scenario according to one embodiment, the first count is tallied with the first field at 214, wherein, based on a commencement of the second period of time, the first count is subsequently shifted from the first field to the second field, and the second count is then tallied with the first field. In one such embodiment, method 200 further comprises tallying a third count of third events with the count register, wherein the third events occur during a third period of time after the second period of time. Based on a commencement of the third period of time, the first count is shifted from the second field to a third field of the count register, and the the second count is shifted from the first field to the second field. After such shifting of the first and second counts, the third count is tallied with the first field.

Although some embodiments are not limited in this regard, method 200 further comprises (at 218) participating in another communication which sends contents of the count register from the performance monitor circuit, the contents comprising multiple event counts. In an embodiment, the participating at 218 comprises automatically pushing the contents from the performance monitor circuit based on each of the multiple fields of the count register each storing a respective event count.

In some embodiments, method further comprises one or more other operations (not shown) to change a programming of the performance monitor circuit from that which is performed at 212. Such one or more other operations include (for example) participating in a second communication which provides to the performance monitor circuit an indication of a second format (which is to be an alternative to the format indicated by the communication at 210). Based on said second communication, the performance monitor circuit is reprogrammed to change a designation of bits of the count register—e.g., where said change is to provide, according to the second format, relatively more fields (or alternatively, fewer fields) of the count register for storing respective event counts.

FIG. 3 shows an example of performance monitor circuitry 300 which is programmable to provide a format of an event count register according to an embodiment. Performance monitor circuitry 300 is an example of an embodiment which, for example, facilitates the performance of some or all of method 200—e.g., wherein one or more of PMON circuits 127, 129, 131, 133 each provide functionality of performance monitor circuitry 300. In various embodiments, performance monitor circuitry 300 is an on-chip hardware resource to monitor discrete performance events during program execution.

As shown in FIG. 3, performance monitor circuitry 300 comprises a count register 340 to serve as a repository of event counts which each correspond to a different respective period of time. Performance monitor circuitry 300 further comprises one or more circuit resources (e.g., including the illustrative configuration register 320 shown) which are programmable—e.g., reprogrammable—to provide configuration state which determines a format according to which count register 340 is to store event counts. For example, performance monitor circuitry 300 further comprises control circuit 310 which supports participation in communications 312—e.g., with configuration interface 104 or other suitable circuitry—whereby a user, an external test unit, a management process and/or other such agent (not shown) specifies or otherwise indicates a format according to which event counts are to be provided at count register 340.

By way of illustration and not limitation, performance monitor circuitry 300 includes, is coupled to, or otherwise operates based on a detector 330 and a timer circuit 350 which are variously coupled to control circuit 310. Detector 330 provides functionality to detect for events which are each of a particular event type, and to tally a count of said events with count register 340. For example, detector 330 includes or otherwise operates with circuitry which updates bits of count register 340 based on the detection of one such event—e.g., wherein said circuitry is to increment or otherwise access bits that, according to a programmed data format, are allocated to serve as one field in count register 340. Alternatively or in addition, such circuitry is operable to shift an event count from one field of multiple fields in count register 340 to another one of said multiple fields. In one such embodiment, such circuitry is operable to limit the tallying of a given event count to a predetermined maximum value which (for example) is based on configuration state provided at configuration register 320.

Based on event monitoring by detector 330, a field of count register 340 is successively incremented or otherwise accessed to keep up-to-date a count of events of a given event type. Such an event type is indicative (for example) of thread level utilization of processor logic and/or other such runtime performance. Example performance events include (but are not limited to) instruction cache misses, data cache misses, instructions executed, branches executed, branch mis-predicts, instruction translation look up buffer (TLB) TLB misses, data TLB misses, stalls due to data dependency, data cache write-back, etc. Although some embodiments are not limited in this regard, count register 340 is a 64 bit register, or a 32 bit register, for example. Different performance monitoring architectures support simultaneous monitoring of more than one type of performance event with multiple count registers—e.g., wherein configuration register 320 is to determine respective formats for each of multiple count registers, and/or wherein performance monitor circuitry 300 comprises multiple configuration registers (including configuration register 320) each to determine the formats of a respective one or more count registers.

Timer circuit 350 provides functionality to indicate to detector 330 a commencement, pendency and/or expiration of a given period of time for which a corresponding event count is to be tallied. For example, timer circuit 350 is coupled to receive a system clock (not shown) or other reference signal for tracking successive periods of time during which different respective event counts are to be tallied. Based on such a reference signal, timer circuit 350 indicates to detector 330 that (for example) the tallying of an event count for a one particular time duration is to be stopped and/or the tallying of another event count for a next successive time duration is to begin.

In an illustrative scenario according to one embodiment, communications 312 specify or otherwise indicate a configuration state to be programmed—e.g., the configuration state comprising one or more parameters to be stored at configuration register 320. The one or more parameters include, for example, a number of data fields each to store a respective event count at count register 340 (and/or a corresponding size, in bits, of a given one field of said data fields). Alternatively or in addition, the one or more parameters include a duration of a period of time during which a given event count is to be tallied, and/or a state of enablement (or disablement) of circuitry to update a given one or more count registers. For example, communications 312 indicate to control circuit 310 a value of a parameter which selectively enables or disables only modifications to data in one count register (which corresponds to said parameter). Alternatively or in addition, communications 312 indicate to control circuit 310 a value of a single parameter which selectively enables or disables modifications to data in any of multiple count registers.

Based on communications 312, control circuit 310 programs configuration register 320 with the one or more parameters, which determine at least in part how event counts are to be tallied with count register 340. For example, count register 340 comprises bits 342, wherein a data format, indicated by the programmed configuration register 320, identifies various sub-sets of bits 342 as being different respective fields (such as the illustrative fields 344a, 344b, ..., 344n shown) which are each to store a respective event count. The programmed configuration register 320 further indicates to timer circuit 350 different successive periods of times for which detector 330 is to tally respective event counts using fields 344a, 344b, ..., 344n.

For example, based on timer circuit 350 indicating the commencement of a first period of time, detector 330 initiates a first tallying of a first count of first events which occur during said first period of time. The first count of the first events is tallied in a first one of fields 344a, 344b, ..., 344n. Subsequently, based on timer circuit 350 indicating the commencement of a second period of time (and, for example, an end of the first period of time), detector 330 initiates a second tallying of a second count of second events which occur during said second period of time. In an embodiment, during and/or after such tallying of the second count, one of fields 344a, 344b, ..., 344n stores the first count concurrent with another of fields 344a, 344b, ..., 344n storing the second count. In one such embodiment, based on timer circuit 350 indicating the commencement of a third period of time (for example, at—or after—an end of the second period of time), detector 330 initiates a third tallying of a third count of third events which occur during said third period of time. For example, during and/or after such tallying of the third count, the first count, the second count, and the third count are concurrently stored each in a different respective one of fields 344a, 344b, ..., 344n.

In one illustrative embodiment, the first count of the first events is tallied (for example) in a first field of count register 340 (e.g., field 344a), wherein—based on a commencement of the second period of time—the first count is shifted from the first field to a second field of count register 340 (e.g., field 344b), and the second count of the second events is tallied in the first field. Subsequently, based on a commencement of the third period of time, the first count is shifted from the second field to a third field of count register 340, wherein the second count is shifted from the first field to the second field, and wherein the third count of the third events is tallied in the first field.

FIG. 4 illustrates features of various data structures to determine the storing of performance information with a count register according to an embodiment. Data structures such as those shown in FIG. 4 provide information used, for example, by device 100 (e.g., by one of PMON circuits 127, 129, 131, 133) or performance monitor circuitry 300—e.g., where such information is used in operations of method 200.

FIG. 4 shows tables 400, 410, 420, and a legend 430 which details information provided by a configuration register which is represented in table 400. More particularly, table 400 illustrates an arrangement of performance monitoring parameters to be provided at a configuration register (such as configuration register 320). As detailed in legend 430, bits 0 through 6 of such a configuration register are allocated to provide a parameter which identifies, for each of one or more count registers, a size (e.g., in bits) of any of one or more fields of the count register which are each to store a respective event count. Furthermore, bits 7 through 59 of said configuration register are allocated to provide a parameter which identifies a length of any period of time for which a given event count is to be tallied with the one or more count registers. In some embodiments, bits 60 through 62 of said configuration register are allocated to provide one or more parameters (e.g., a bitmap, a flag field, or the like) which identifies, for each of multiple count registers, a respective state of enablement (or disablement) of functionality to tally an event count with the count register. Additionally, or alternatively, a bit 63 of said configuration register is allocated to provide a parameter which identifies a common state of enablement (or disablement) of functionality to tally any event count with the multiple count registers.

Table 410 shows an arrangement of fields in an event count register A (such as count register 340), where the arrangement is according to a format indicated by the parameters illustrated in table 400. In the example embodiment shown, count register A is formatted to provide M fields (where the integer M is, for example, greater than one) each to function as a "sub-counter" to store a respective event count. More particularly, a first sub-counter field comprises bits 0 through (n-1) of the count register A, where a second sub-counter field comprises bits n through (2n-1) of the count register A, and where the Mth sub-counter field comprises bits (Mn-n) through (Mn-1) of the count register A.

In various embodiments, the parameters illustrated by table 400 provide the same field format for more than one event count register. Additionally or alternatively, one or more other count registers each have a respective field format other than that indicated by table 410. For example, some embodiments provide multiple configuration registers each to define, for a corresponding one or more count registers, a respective field format to be provided by each of said one or more count registers. In one example embodiment (as illustrated by table 420), another event count register X is formatted to provide only a single event count spanning bits 0 through 63 thereof. For example, count register X is formatted with a configuration register other than the one used to format count register A. In one such embodiment, the one field of count register X is to store an even count which is an accumulation (e.g., a sum) of event counts stored by fields of count register A (and, in some embodiments, fields of one or more other count registers).

Figure 5:
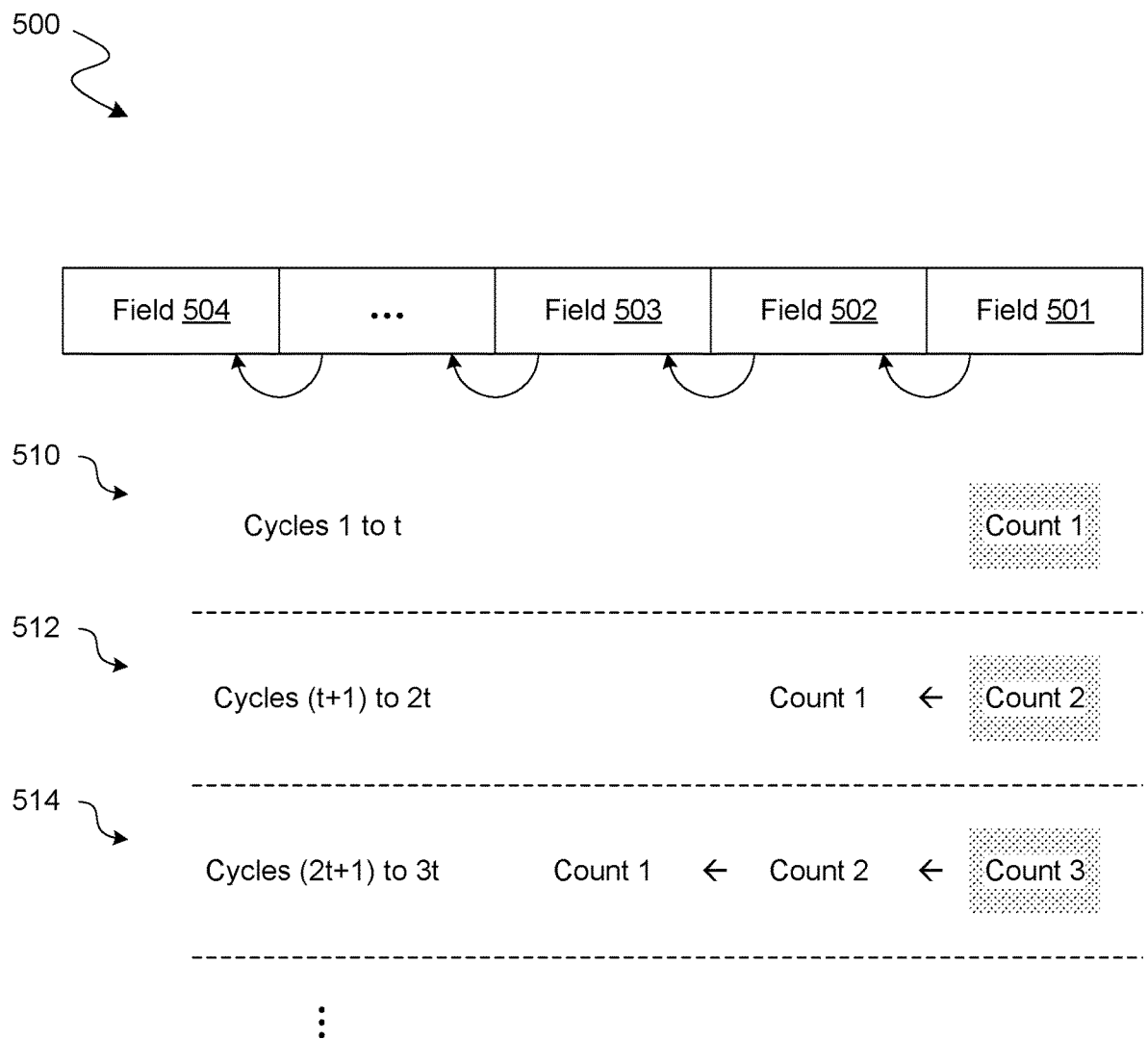
FIG. 5 illustrates a sequence diagram showing operations to provide event count values at a register according to an embodiment.

FIG. 5 shows a sequence diagram 500 illustrating a sequential tallying of event counts with a count register according to an embodiment. Tallying such as that illustrated in sequence diagram 500 is provided, for example, with one of device 100 or performance monitor circuitry 300—e.g., wherein method 200 comprises some or all of said tallying.

As shown in sequence diagram 500, performance monitor circuitry is (re)programmed to provide, with a count register (such as count register 340), multiple fields—such as the illustrative fields 501, 502, 503, ..., 504 shown—which are to concurrently store respective event counts. In an illustrative scenario according to one embodiment, a first count (Count 1) is tallied with field 501 during a period of time 510 which—for example—includes cycles 1 through t of a reference signal (e.g., a system clock). Based on a commencement of a next period of time 512 which includes cycles (t+1) through 2t of the reference signal, the first count is shifted from field 501 to field 502, and a second count (Count 2) is then tallied with field 501. Based on a commencement of a next period of time 514 which includes cycles (2t+1) through 3t of the reference signal, the first count is shifted from field 502 to field 503, where the second count is shifted from field 501 to field 502, and a third count (Count 2) is then tallied with field 501. Such sequential shifting and tallying is repeated, for example, until all fields of the count register each store a respective event count.

Figure 6:
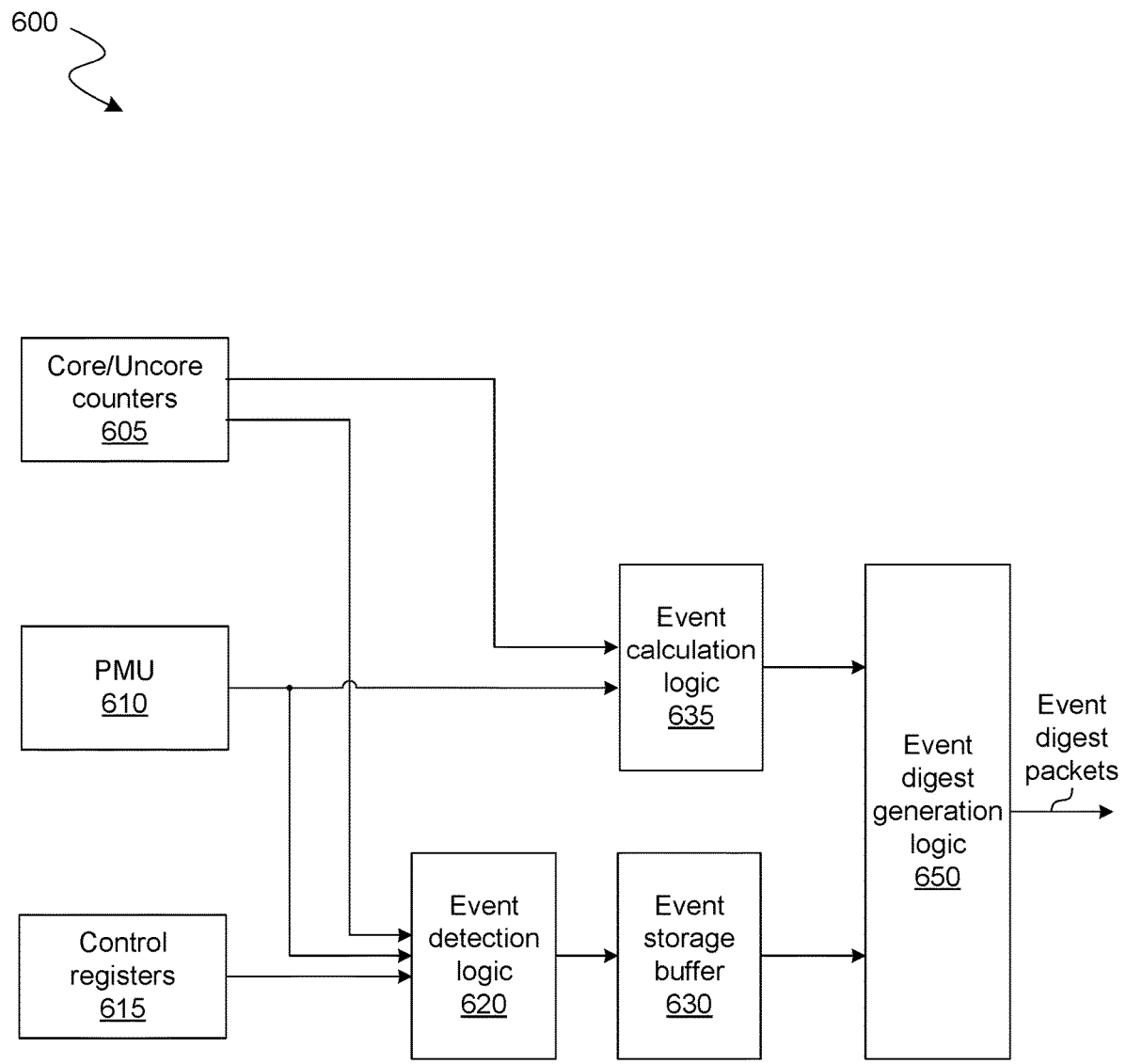
FIG. 6 illustrates a functional block diagram showing features of a system to provide performance monitoring information according to an embodiment.

Referring now to FIG. 6, shown is a block diagram of a system 600 to provide performance monitoring information in accordance with an embodiment. In one embodiment, system 600 is implemented at least in part with any of a variety of combinations of hardware resources (e.g., including a performance monitor circuit, telemetry circuitry, power management circuitry, or the like) and/or software resources of the processor. However, it is to be appreciated that the scope of various embodiments is not limited in this regard, and that system 600 is alternatively implemented with other hardware and/or software. As seen, system 600 includes or is coupled to receive information from various sources within a processor. In the embodiment shown, an event detection logic 620 receives incoming information from a set of core/uncore counters 605, a PMU 610, and a set of control registers 615. In an embodiment, core/uncore counters 605 include various counters within a core or uncore of a processor that (for example) are separate from the counters or other performance monitors of PMU 610. As an example, core/uncore counters 605 are configured to detect events indicating resource utilization, performance parameters like instructions per cycle, last level cache misses and so forth.

In turn, PMU 610 communicates information from a wide variety of counters that are available to the PMU. As some examples, such counters include cache misses, instructions per cycle, among many other count types. In various embodiments, performance monitor circuitry of system 600 is programmable to determine for each of one or more count registers—of core/uncore counters 605 and/or PMU 610, for example—a respective format according to which a given count register is to concurrently store event counts each in a different respective field.

In addition, event detection logic 620 receives information from a set of control registers 615, which in an embodiment includes threshold information such as a corresponding threshold for at least some of counters available in counters 605 and PMU 610. In an embodiment, these control registers 615 are programmed via information received from a performance management process, an external test/debug/trace device or other such agent.

Still referring to FIG. 6, such information is provided to event detection logic 620, which acts to generate events based on a given count value of one or more counters and (for example) based on a corresponding one or more threshold values. As seen, these generated events can be provided to an event storage buffer 630.

Alternatively or in addition, an event calculation logic 635 is provided to receive at least certain values from the core/uncore counters 605. Using event calculation logic 635, other events can be generated based on these counters, which (for example) correspond to either firmware-based counters or combined hardware/firmware-based counters, details of which are described further below.

Still referring to FIG. 6 in turn information from event calculation logic 635 and event storage buffer 630 can be provided to an event digest generation logic 650, which can thus generate a corresponding event digest packet for communication to an external entity—e.g., via a sideband channel. Different implementations of an event digest are possible. In broadest terms, an event digest is a packet or other data structure that provides information about which counters of a predetermined set of counters indicate a respective one or more events within a time interval under analysis. Although shown at this high level in the embodiment of FIG. 6, understand the scope of the present invention is not limited in this regard.

The figures described herein detail exemplary architectures and systems to implement embodiments of the above. In some embodiments, one or more hardware components and/or instructions described herein are emulated as detailed below, or implemented as software modules.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 7A is a block diagram illustrating both an exemplary in-order pipeline and an exemplary register renaming, out-of-order issue/execution pipeline according to embodiments of the invention. FIG. 7B is a block diagram illustrating both an exemplary embodiment of an in-order architecture core and an exemplary register renaming, out-of-order issue/execution architecture core to be included in a processor according to embodiments of the invention. The solid lined boxes in FIGS. 7A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 7A, a processor pipeline 700 includes a fetch stage 702, a length decode stage 704, a decode stage 706, an allocation stage 708, a renaming stage 710, a scheduling (also known as a dispatch or issue) stage 712, a register read/memory read stage 714, an execute stage 716, a write back/memory write stage 718, an exception handling stage 722, and a commit stage 724.

FIG. 7B shows processor core 790 including a front end unit 730 coupled to an execution engine unit 750, and both are coupled to a memory unit 770. The core 790 may be a reduced instruction set computing (RISC) core, a complex instruction set computing (CISC) core, a very long instruction word (VLIW) core, or a hybrid or alternative core type. As yet another option, the core 790 may be a special-purpose core, such as, for example, a network or communication core, compression engine, coprocessor core, general purpose computing graphics processing unit (GPGPU) core, graphics core, or the like.

The front end unit 730 includes a branch prediction unit 732 coupled to an instruction cache unit 734, which is coupled to an instruction translation lookaside buffer (TLB) 736, which is coupled to an instruction fetch unit 738, which is coupled to a decode unit 740. The decode unit 740 (or decoder) may decode instructions, and generate as an output one or more micro-operations, micro-code entry points, microinstructions, other instructions, or other control signals, which are decoded from, or which otherwise reflect, or are derived from, the original instructions. The decode unit 740 may be implemented using various different mechanisms. Examples of suitable mechanisms include, but are not limited to, look-up tables, hardware implementations, programmable logic arrays (PLAs), microcode read only memories (ROMs), etc. In one embodiment, the core 790 includes a microcode ROM or other medium that stores microcode for certain macroinstructions (e.g., in decode unit 740 or otherwise within the front end unit 730). The decode unit 740 is coupled to a rename/allocator unit 752 in the execution engine unit 750.

The execution engine unit 750 includes the rename/allocator unit 752 coupled to a retirement unit 754 and a set of one or more scheduler unit(s) 756. The scheduler unit(s) 756 represents any number of different schedulers, including reservations stations, central instruction window, etc. The scheduler unit(s) 756 is coupled to the physical register file(s) unit(s) 758. Each of the physical register file(s) units 758 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 758 comprises a vector registers unit, a write mask registers unit, and a scalar registers unit. These register units may provide architectural vector registers, vector mask registers, and general purpose registers. The physical register file(s) unit(s) 758 is overlapped by the retirement unit 754 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 754 and the physical register file(s) unit(s) 758 are coupled to the execution cluster(s) 760. The execution cluster(s) 760 includes a set of one or more execution units 762 and a set of one or more memory access units 764. The execution units 762 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 756, physical register file(s) unit(s) 758, and execution cluster(s) 760 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 764). It should also be understood that where separate pipelines are used, one or more of these pipelines may be out-of-order issue/execution and the rest in-order.

The set of memory access units 764 is coupled to the memory unit 770, which includes a data TLB unit 772 coupled to a data cache unit 774 coupled to a level 2 (L2) cache unit 776. In one exemplary embodiment, the memory access units 764 may include a load unit, a store address unit, and a store data unit, each of which is coupled to the data TLB unit 772 in the memory unit 770. The instruction cache unit 734 is further coupled to a level 2 (L2) cache unit 776 in the memory unit 770. The L2 cache unit 776 is coupled to one or more other levels of cache and eventually to a main memory.

By way of example, the exemplary register renaming, out-of-order issue/execution core architecture may implement the pipeline 700 as follows: 1) the instruction fetch 738 performs the fetch and length decoding stages 702 and 704; 2) the decode unit 740 performs the decode stage 706; 3) the rename/allocator unit 752 performs the allocation stage 708 and renaming stage 710; 4) the scheduler unit(s) 756 performs the schedule stage 712; 5) the physical register file(s) unit(s) 758 and the memory unit 770 perform the register read/memory read stage 714; the execution cluster 760 perform the execute stage 716; 6) the memory unit 770 and the physical register file(s) unit(s) 758 perform the write back/memory write stage 718; 7) various units may be involved in the exception handling stage 722; and 8) the retirement unit 754 and the physical register file(s) unit(s) 758 perform the commit stage 724.

The core 790 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 790 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 734/QAE74 and a shared L2 cache unit 776, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

FIGS. 8A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 8A is a block diagram of a single processor core, along with its connection to the on-die interconnect network 802 and with its local subset of the Level 2 (L2) cache 804, according to embodiments of the invention. In one embodiment, an instruction decoder 800 supports the x86 instruction set with a packed data instruction set extension. An L1 cache 806 allows low-latency accesses to cache memory into the scalar and vector units. While in one embodiment (to simplify the design), a scalar unit 808 and a vector unit 810 use separate register sets (respectively, scalar registers 812 and vector registers 814) and data transferred between them is written to memory and then read back in from a level 1 (L1) cache 806, alternative embodiments of the invention may use a different approach (e.g., use a single register set or include a communication path that allow data to be transferred between the two register files without being written and read back).

The local subset of the L2 cache 804 is part of a global L2 cache that is divided into separate local subsets, one per processor core. Each processor core has a direct access path to its own local subset of the L2 cache 804. Data read by a processor core is stored in its L2 cache subset 804 and can be accessed quickly, in parallel with other processor cores accessing their own local L2 cache subsets. Data written by a processor core is stored in its own L2 cache subset 804 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 8B is an expanded view of part of the processor core in FIG. 8A according to embodiments of the invention. FIG. 8B includes an L1 data cache 806A part of the L1 cache 806, as well as more detail regarding the vector unit 810 and the vector registers 814. Specifically, the vector unit 810 is a 16-wide vector processing unit (VPU) (see the 16-wide ALU 828), which executes one or more of integer, single-precision float, and double-precision float instructions. The VPU supports swizzling the register inputs with swizzle unit 820, numeric conversion with numeric convert units 822A-B, and replication with replication unit 824 on the memory input. Write mask registers 826 allow predicating resulting vector writes.

Figure 9:
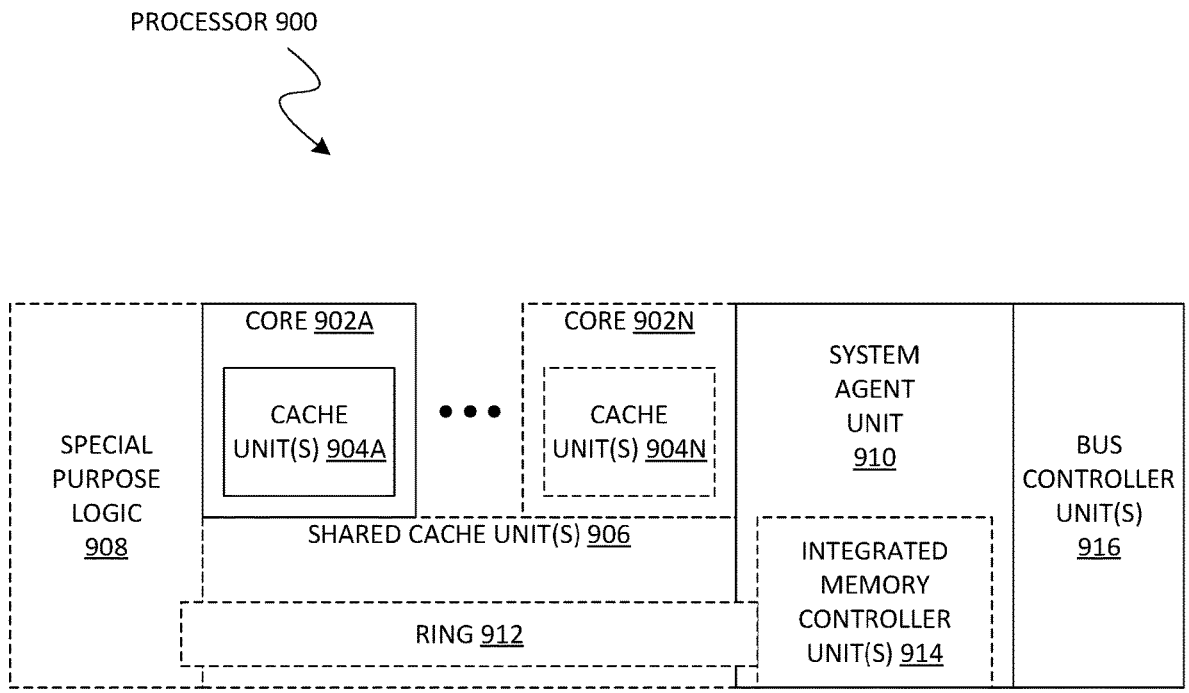
FIG. 9 is a block diagram of a processor that may have more than one core, may have an integrated memory controller, and may have integrated graphics according to embodiments of the invention.

FIG. 9 is a block diagram of a processor 900 that may have more than one core, may have an integrated memory controller, and may have integrated graphics according to embodiments of the invention. The solid lined boxes in FIG. 9 illustrate a processor 900 with a single core 902A, a system agent 910, a set of one or more bus controller units 916, while the optional addition of the dashed lined boxes illustrates an alternative processor 900 with multiple cores 902A-N, a set of one or more integrated memory controller unit(s) 914 in the system agent unit 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes respective one or more levels of caches 904A-N within cores 902A-N, a set or one or more shared cache units 906, and external memory (not shown) coupled to the set of integrated memory controller units 914. The set of shared cache units 906 may include one or more mid-level caches, such as level 2 (L2), level 3 (L3), level 4 (L4), or other levels of cache, a last level cache (LLC), and/or combinations thereof. While in one embodiment a ring based interconnect unit 912 interconnects the special purpose logic 908, the set of shared cache units 906, and the system agent unit 910/integrated memory controller unit(s) 914, alternative embodiments may use any number of well-known techniques for interconnecting such units. In one embodiment, coherency is maintained between one or more cache units 906 and cores 902-A-N.

In some embodiments, one or more of the cores 902A-N are capable of multi-threading. The system agent 910 includes those components coordinating and operating cores 902A-N. The system agent unit 910 may include for example a power control unit (PCU) and a display unit. The PCU may be or include logic and components needed for regulating the power state of the cores 902A-N and the integrated graphics logic 908. The display unit is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set.

Exemplary Computer Architectures

FIGS. 10 through 13 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
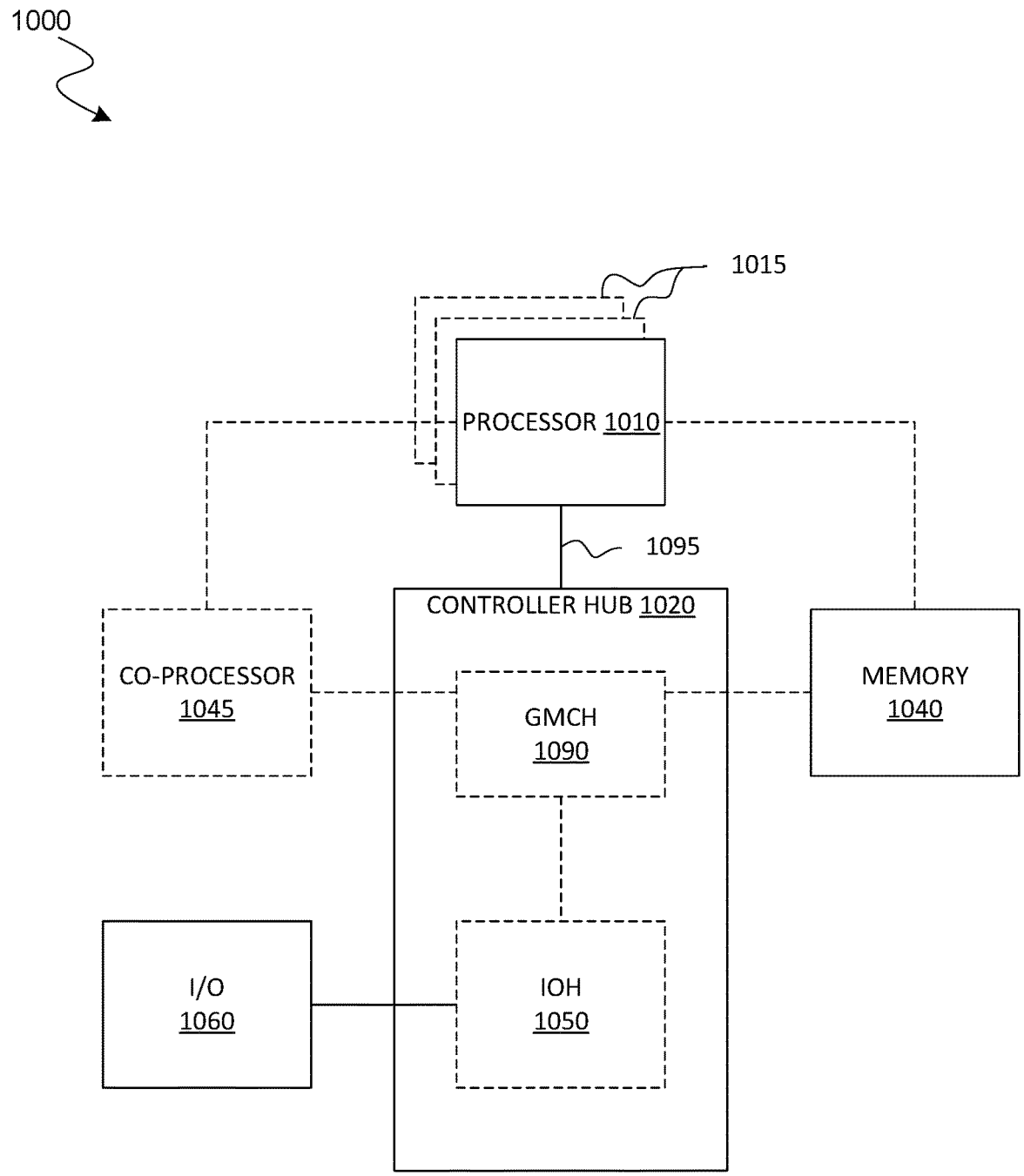
FIGS. 10 through 13 are block diagrams of exemplary computer architectures.

Referring now to FIG. 10, shown is a block diagram of a system 1000 in accordance with one embodiment of the present invention. The system 1000 may include one or more processors 1010, 1015, which are coupled to a controller hub 1020. In one embodiment the controller hub 1020 includes a graphics memory controller hub (GMCH) 1090 and an Input/Output Hub (IOH) 1050 (which may be on separate chips); the GMCH 1090 includes memory and graphics controllers to which are coupled memory 1040 and a coprocessor 1045; the IOH 1050 couples input/output (I/O) devices 1060 to the GMCH 1090. Alternatively, one or both of the memory and graphics controllers are integrated within the processor (as described herein), the memory 1040 and the coprocessor 1045 are coupled directly to the processor 1010, and the controller hub 1020 in a single chip with the IOH 1050.

The optional nature of additional processors 1015 is denoted in FIG. 10 with broken lines. Each processor 1010, 1015 may include one or more of the processing cores described herein and may be some version of the processor 900.

The memory 1040 may be, for example, dynamic random access memory (DRAM), phase change memory (PCM), or a combination of the two. For at least one embodiment, the controller hub 1020 communicates with the processor(s) 1010, 1015 via a multi-drop bus, such as a frontside bus (FSB), point-to-point interface such as QuickPath Interconnect (QPI), or similar connection 1095.

In one embodiment, the coprocessor 1045 is a special-purpose processor, such as, for example, a high-throughput MIC processor, a network or communication processor, compression engine, graphics processor, GPGPU, embedded processor, or the like. In one embodiment, controller hub 1020 may include an integrated graphics accelerator.

There can be a variety of differences between the processors 1010, 1015 in terms of a spectrum of metrics of merit including architectural, microarchitectural, thermal, power consumption characteristics, and the like.

In one embodiment, the processor 1010 executes instructions that control data processing operations of a general type. Embedded within the instructions may be coprocessor instructions. The processor 1010 recognizes these coprocessor instructions as being of a type that should be executed by the attached coprocessor 1045. Accordingly, the processor 1010 issues these coprocessor instructions (or control signals representing coprocessor instructions) on a coprocessor bus or other interconnect, to coprocessor 1045. Coprocessor(s) 1045 accept and execute the received coprocessor instructions.

Figure 11:
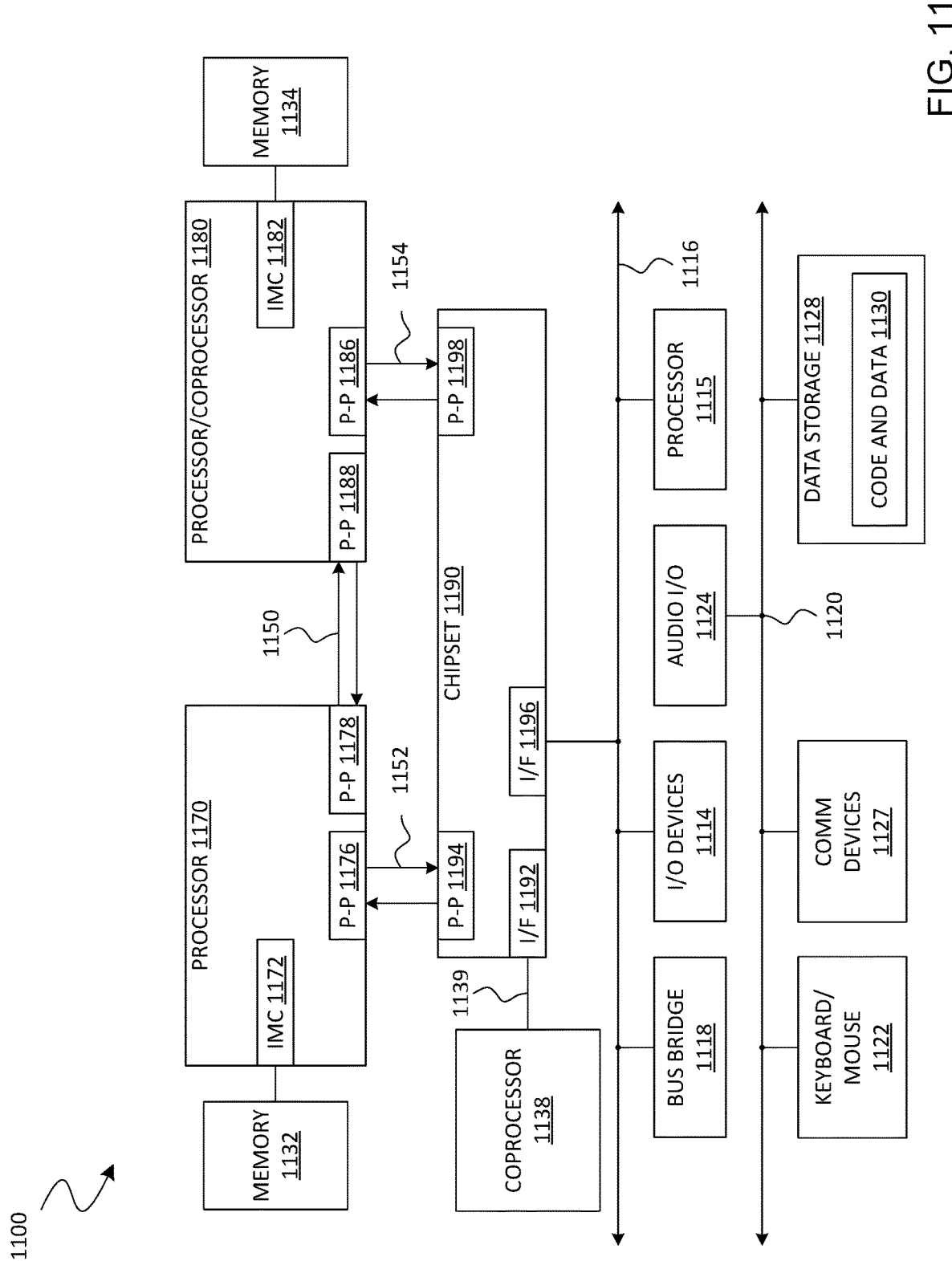

Referring now to FIG. 11, shown is a block diagram of a first more specific exemplary system 1100 in accordance with an embodiment of the present invention. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of the processor 900. In one embodiment of the invention, processors 1170 and 1180 are respectively processors 1010 and 1015, while coprocessor 1138 is coprocessor 1045. In another embodiment, processors 1170 and 1180 are respectively processor 1010 coprocessor 1045.

Processors 1170 and 1180 are shown including integrated memory controller (IMC) units 1172 and 1182, respectively. Processor 1170 also includes as part of its bus controller unit's point-to-point (P-P) interfaces 1176 and 1178; similarly, second processor 1180 includes P-P interfaces 1186 and 1188. Processors 1170, 1180 may exchange information via a point-to-point (P-P) interconnect 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may optionally exchange information with the coprocessor 1138 via a high-performance interface 1192 and an interconnect 1139. In one embodiment, the coprocessor 1138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present invention is not so limited.

As shown in FIG. 11, various I/O devices 1114 may be coupled to first bus 1116, along with a bus bridge 1118 which couples first bus 1116 to a second bus 1120. In one embodiment, one or more additional processor(s) 1115, such as coprocessors, high-throughput MIC processors, GPGPU's, accelerators (such as, e.g., graphics accelerators or digital signal processing (DSP) units), field programmable gate arrays, or any other processor, are coupled to first bus 1116. In one embodiment, second bus 1120 may be a low pin count (LPC) bus. Various devices may be coupled to a second bus 1120 including, for example, a keyboard and/or mouse 1122, communication devices 1127 and a storage unit 1128 such as a disk drive or other mass storage device which may include instructions/code and data 1130, in one embodiment. Further, an audio I/O 1124 may be coupled to the second bus 1120. Note that other architectures are possible. For example, instead of the point-to-point architecture of FIG. 11, a system may implement a multi-drop bus or other such architecture.

Figure 12:
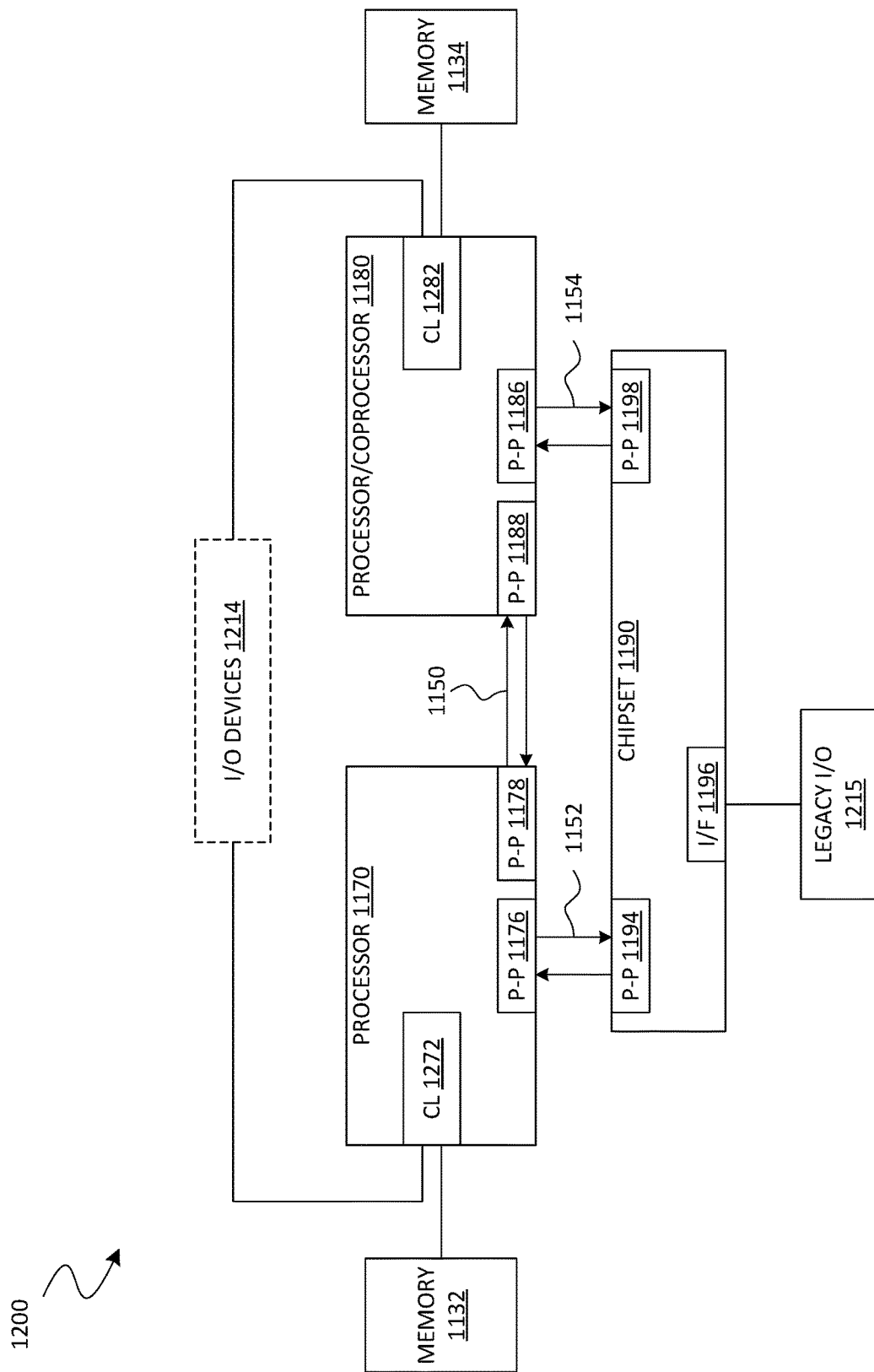

Referring now to FIG. 12, shown is a block diagram of a second more specific exemplary system 1200 in accordance with an embodiment of the present invention. Like elements in FIGS. 11 and 12 bear like reference numerals, and certain aspects of FIG. 11 have been omitted from FIG. 12 in order to avoid obscuring other aspects of FIG. 12.

FIG. 12 illustrates that the processors 1170, 1180 may include integrated memory and I/O control logic ("CL") 1272 and 1282, respectively. Thus, the CL 1272, 1282 include integrated memory controller units and include I/O control logic. FIG. 12 illustrates that not only are the memories 1132, 1134 coupled to the CL 1272, 1282, but also that I/O devices 1214 are also coupled to the control logic 1272, 1282. Legacy I/O devices 1215 are coupled to the chipset 1190.

Figure 13:
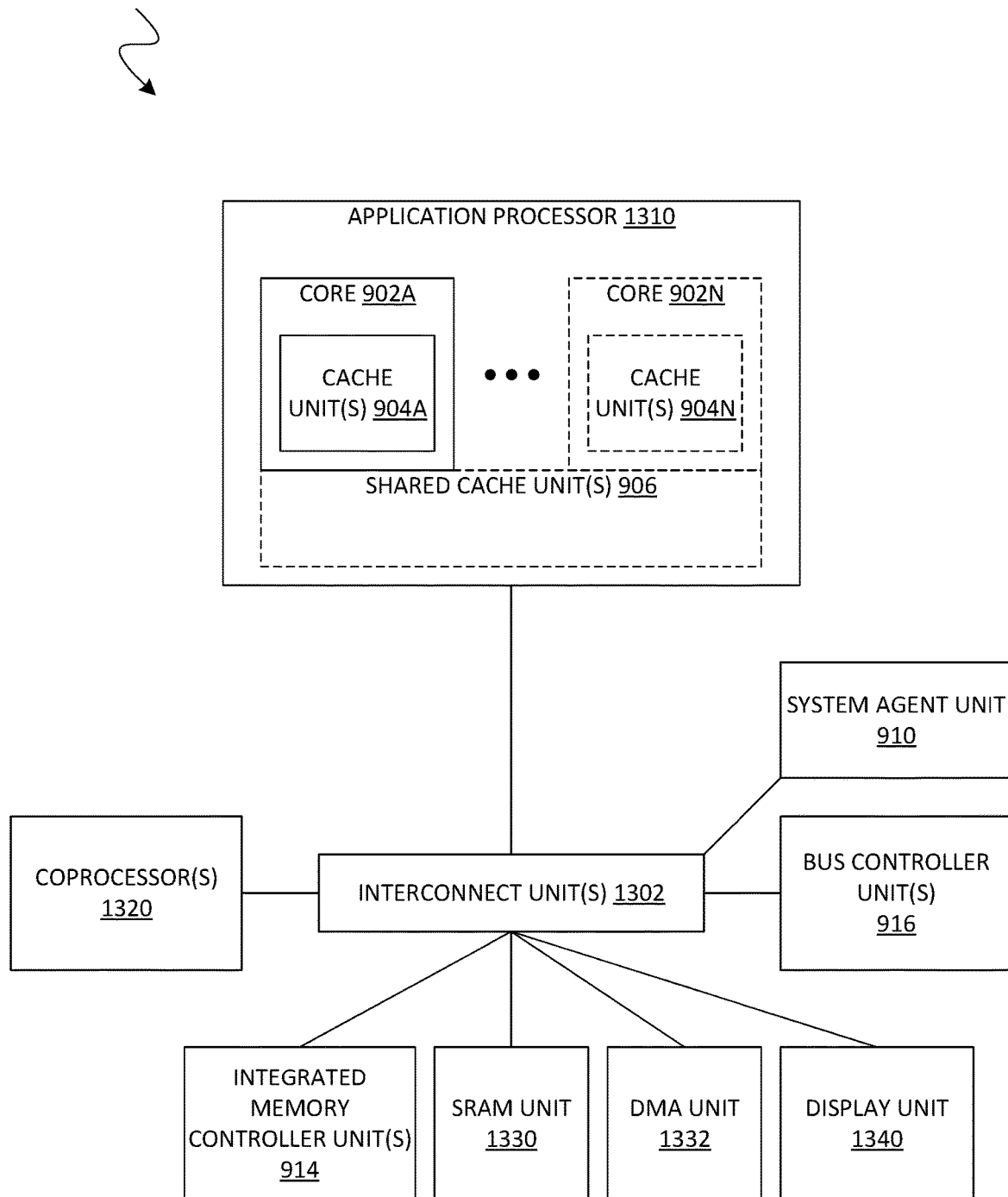

Referring now to FIG. 13, shown is a block diagram of a SoC 1300 in accordance with an embodiment of the present invention. Similar elements in FIG. 9 bear like reference numerals. Also, dashed lined boxes are optional features on more advanced SoCs. In FIG. 13, an interconnect unit(s) 1302 is coupled to: an application processor 1310 which includes a set of one or more cores 902A-N and shared cache unit(s) 906; a system agent unit 910; a bus controller unit(s) 916; an integrated memory controller unit(s) 914; a set or one or more coprocessors 1320 which may include integrated graphics logic, an image processor, an audio processor, and a video processor; an static random access memory (SRAM) unit 1330; a direct memory access (DMA) unit 1332; and a display unit 1340 for coupling to one or more external displays. In one embodiment, the coprocessor(s) 1320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1130 illustrated in FIG. 11, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 14:
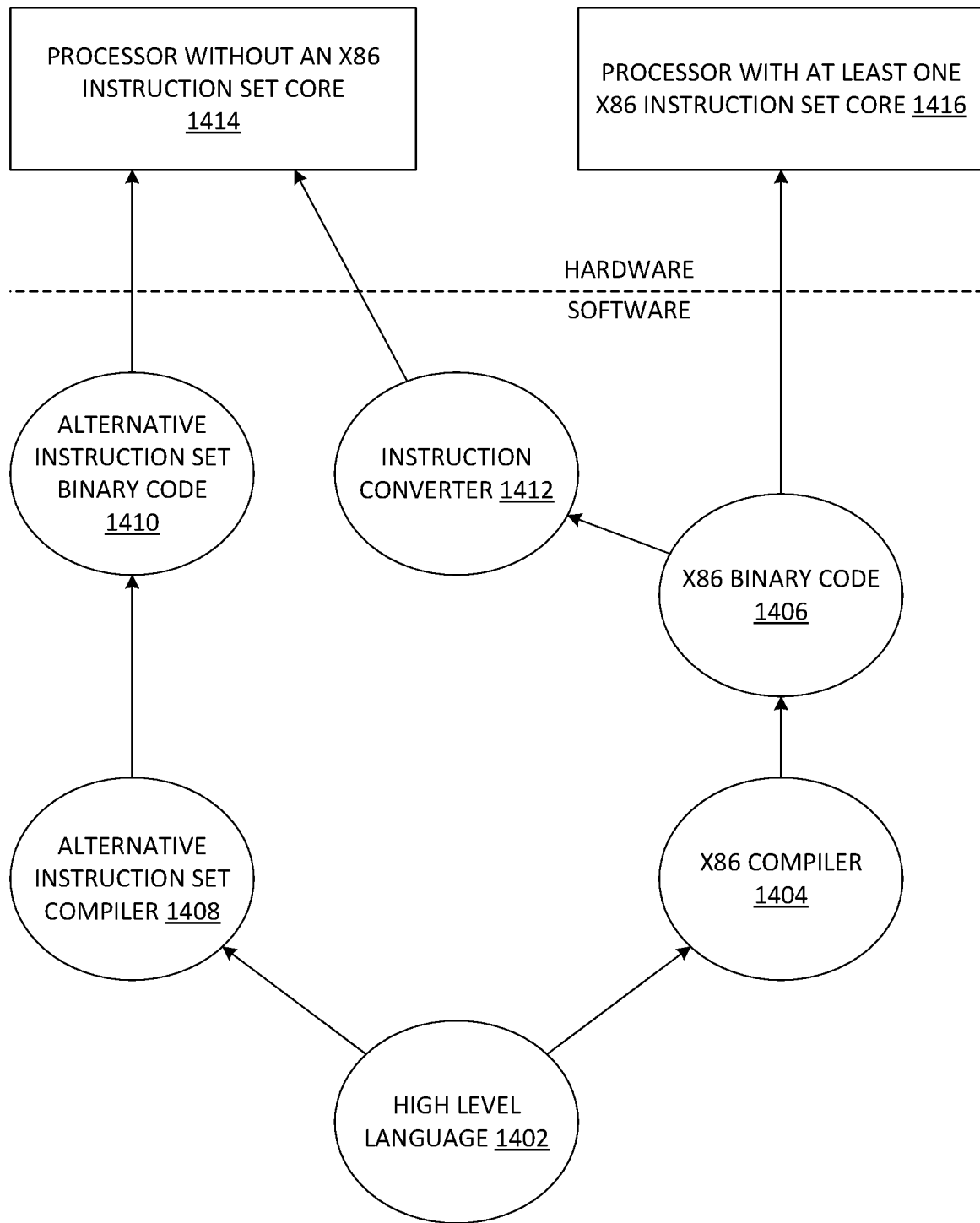
FIG. 14 is a block diagram contrasting the use of a software instruction converter to convert binary instructions in a source instruction set to binary instructions in a target instruction set according to embodiments of the invention.

FIG. 14 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 14 shows a program in a high level language 1402 may be compiled using an x86 compiler 1404 to generate x86 binary code 1406 that may be natively executed by a processor with at least one x86 instruction set core 1416. The processor with at least one x86 instruction set core 1416 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1404 represents a compiler that is operable to generate x86 binary code 1406 (e.g., object code) that can, with or without additional linkage processing, be executed on the processor with at least one x86 instruction set core 1416. Similarly, FIG. 14 shows the program in the high level language 1402 may be compiled using an alternative instruction set compiler 1408 to generate alternative instruction set binary code 1410 that may be natively executed by a processor without at least one x86 instruction set core 1414 (e.g., a processor with cores that execute the MIPS instruction set of MIPS Technologies of Sunnyvale, CA and/or that execute the ARM instruction set of ARM Holdings of Sunnyvale, CA). The instruction converter 1412 is used to convert the x86 binary code 1406 into code that may be natively executed by the processor without an x86 instruction set core 1414. This converted code is not likely to be the same as the alternative instruction set binary code 1410 because an instruction converter capable of this is difficult to make; however, the converted code will accomplish the general operation and be made up of instructions from the alternative instruction set. Thus, the instruction converter 1412 represents software, firmware, hardware, or a combination thereof that, through emulation, simulation or any other process, allows a processor or other electronic device that does not have an x86 instruction set processor or core to execute the x86 binary code 1406.

In one or more first embodiments, a performance monitor circuit comprises first circuitry to participate in a communication which provides to the performance monitor circuit an indication of a format which comprises multiple fields each to store a respective event count, second circuitry, coupled to the first circuitry, to program the performance monitor circuit, based on the communication, to designate first bits of a register to provide a first field according to the format, and designate second bits of the register to provide a second field according to the format, third circuitry, coupled to the second circuitry, to tally, with the register a first count of first events which occur during a first period of time, and a second count of second events which occur during a second period of time after the first period of time, wherein the first field and the second field concurrently store the first count and the second count.

In one or more second embodiments, further to the first embodiment, the first count is tallied with the first field, and based on a commencement of the second period of time the first count is shifted from the first field to the second field, and the second count is tallied with the first field.

In one or more third embodiments, further to the second embodiment, the third circuitry is further to tally, with the register, a third count of third events which occur during a third period of time after the second period of time, wherein, based on a commencement of the third period of time the first count is shifted from the second field to a third field of the register, the second count is shifted from the first field to the second field, and the third count is tallied with the first field.

In one or more fourth embodiments, further to the first embodiment or the second embodiment, the second circuitry to program the performance monitor circuit based on the communication further to determine a value which represents a length of time to tally any of multiple event counts with the register.

In one or more fifth embodiments, further to any of the first through second embodiments, the second circuitry is to program the performance monitor circuit based on the communication to provide, for each of multiple registers, respective fields of the register according to the format.

In one or more sixth embodiments, further to any of the first through second embodiments, the second circuitry to program the performance monitor circuit comprises the second circuitry to set a maximum count to be tallied with one of the first field or the second field.

In one or more seventh embodiments, further to any of the first through second embodiments, the communication comprises a parameter to enable or disable a modification of data at the register.

In one or more eighth embodiments, further to any of the first through second embodiments, the first circuitry is further to participate in another communication which sends contents of the register from the performance monitor circuit, wherein the contents are to comprise multiple event counts.

In one or more ninth embodiments, further to any of the first through second embodiments, the first circuitry is further to participate in a second communication which provides to the performance monitor circuit a second indication of a second format, and the second circuitry is further to reprogram the performance monitor circuit, based on the second communication, to change a designation of bits of the register to provide fields according to the second format.

In one or more tenth embodiments, a system comprises a performance monitor circuit comprising first circuitry to participate in a communication which provides to the performance monitor circuit an indication of a format which comprises multiple fields each to store a respective event count, second circuitry, coupled to the first circuitry, to program the performance monitor circuit, based on the communication, to designate first bits of a register to provide a first field according to the format, and designate second bits of the register to provide a second field according to the format, third circuitry, coupled to the second circuitry, to tally, with the register a first count of first events which occur during a first period of time, and a second count of second events which occur during a second period of time after the first period of time, wherein the first field and the second field concurrently store the first count and the second count. The system further comprises a display device coupled to the performance monitor circuit, the display device to display an image base on a signal communicated with the performance monitor circuit.

In one or more eleventh embodiments, further to the tenth embodiment, the first count is tallied with the first field, and based on a commencement of the second period of time the first count is shifted from the first field to the second field, and the second count is tallied with the first field.

In one or more twelfth embodiments, further to the twelfth embodiment, the third circuitry is further to tally, with the register, a third count of third events which occur during a third period of time after the second period of time, wherein, based on a commencement of the third period of time the first count is shifted from the second field to a third field of the register, the second count is shifted from the first field to the second field, and the third count is tallied with the first field.

In one or more thirteenth embodiments, further to the tenth embodiment or the eleventh embodiment, the second circuitry is to program the performance monitor circuit based on the communication further to determine a value which represents a length of time to tally any of multiple event counts with the register.

In one or more fourteenth embodiments, further to any of the tenth through eleventh embodiments, the second circuitry is to program the performance monitor circuit based on the communication to provide, for each of multiple registers, respective fields of the register according to the format.

In one or more fifteenth embodiments, further to any of the tenth through eleventh embodiments, the second circuitry to program the performance monitor circuit comprises the second circuitry to set a maximum count to be tallied with one of the first field or the second field.

In one or more sixteenth embodiments, further to any of the tenth through eleventh embodiments, the communication comprises a parameter to enable or disable a modification of data at the register.

In one or more seventeenth embodiments, further to any of the tenth through eleventh embodiments, the first circuitry is further to participate in another communication which sends contents of the register from the performance monitor circuit, wherein the contents are to comprise multiple event counts.

In one or more eighteenth embodiments, further to any of the tenth through eleventh embodiments, the first circuitry is further to participate in a second communication which provides to the performance monitor circuit a second indication of a second format, and the second circuitry is further to reprogram the performance monitor circuit, based on the second communication, to change a designation of bits of the register to provide fields according to the second format.

In one or more nineteenth embodiments, a method comprises participating in a communication which provides to a performance monitor circuit an indication of a format comprising multiple fields each to store a respective event count, based on the communication, programming the performance monitor circuit to designate first bits of a register to provide a first field according to the format, and designate second bits of the register to provide a second field according to the format, with the register, tallying a first count of first events which occur during a first period of time, and with the register, tallying a second count of second events which occur during a second period of time after the first period of time, wherein the first field and the second field concurrently store the first count and the second count.

In one or more twentieth embodiments, further to the nineteenth embodiment, the first count is tallied with the first field, and based on a commencement of the second period of time the first count is shifted from the first field to the second field, and the second count is tallied with the first field.

In one or more twenty-first embodiments, further to the twentieth embodiment, the method further comprises with the register, tallying a third count of third events which occur during a third period of time after the second period of time, wherein, based on a commencement of the third period of time the first count is shifted from the second field to a third field of the register, the second count is shifted from the first field to the second field, and the third count is tallied with the first field.

In one or more twenty-second embodiments, further to the nineteenth embodiment or the twentieth embodiment, programming the performance monitor circuit based on the communication is further to determine a value representing a length of time to tally any of multiple event counts with the register.

In one or more twenty-third embodiments, further to any of the nineteenth through twentieth embodiments, programming the performance monitor circuit based on the communication is to provide, for each of multiple registers, respective fields of the register according to the format.

In one or more twenty-fourth embodiments, further to any of the tenth through twentieth embodiments, programming the performance monitor circuit comprises setting a maximum count to be tallied with one of the first field or the second field.

In one or more twenty-fifth embodiments, further to any of the nineteenth through twentieth embodiments, the communication comprises a parameter to enable or disable a modification of data at the register.

In one or more twenty-sixth embodiments, further to any of the nineteenth through twentieth embodiments, the method further comprises participating in another communication which sends contents of the register from the performance monitor circuit, the contents comprising multiple event counts.

In one or more twenty-seventh embodiments, further to any of the nineteenth through twentieth embodiments, the method further comprises participating in a second communication which provides to the performance monitor circuit a second indication of a second format, and reprogramming the performance monitor circuit, based on the second communication, to change a designation of bits of the register to provide fields according to the second format.

Techniques and architectures for providing performance monitoring information are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A performance monitor circuit comprising:
   first circuitry to participate in a communication which provides to the performance monitor circuit an indication of a format which comprises multiple fields each to store a respective event count;
   second circuitry, coupled to the first circuitry, to program the performance monitor circuit, based on the communication, to:
      designate first bits of a register to provide a first field according to the format; and
      designate second bits of the register to provide a second field according to the format;
   third circuitry, coupled to the second circuitry, to tally, with the register:
      a first count of first events which occur during a first period of time; and
      a second count of second events which occur during a second period of time after the first period of time, wherein the first field and the second field concurrently store the first count and the second count.

2. The performance monitor circuit of claim 1, wherein:
   the first count is tallied with the first field; and
   based on a commencement of the second period of time:
      the first count is shifted from the first field to the second field; and
      the second count is tallied with the first field.

3. The performance monitor circuit of claim 2, the third circuitry further to tally, with the register, a third count of third events which occur during a third period of time after the second period of time;
   wherein, based on a commencement of the third period of time:
      the first count is shifted from the second field to a third field of the register; and
      the second count is shifted from the first field to the second field; and
      the third count is tallied with the first field.

4. The performance monitor circuit of claim 1, wherein the second circuitry to program the performance monitor circuit based on the communication further to determine a value which represents a length of time to tally any of multiple event counts with the register.

5. The performance monitor circuit of claim 1, wherein the second circuitry is to program the performance monitor circuit based on the communication to provide, for each of multiple registers, respective fields of the register according to the format.

6. The performance monitor circuit of claim 1, wherein the second circuitry to program the performance monitor circuit comprises the second circuitry to set a maximum count to be tallied with one of the first field or the second field.

7. The performance monitor circuit of claim 1, wherein the communication comprises a parameter to enable or disable a modification of data at the register.

8. The performance monitor circuit of claim 1, the first circuitry further to participate in another communication which sends contents of the register from the performance monitor circuit, wherein the contents are to comprise multiple event counts.

9. The performance monitor circuit of claim 1, wherein:
   the first circuitry is further to participate in a second communication which provides to the performance monitor circuit a second indication of a second format; and
   the second circuitry is further to reprogram the performance monitor circuit, based on the second communication, to change a designation of bits of the register to provide fields according to the second format.

10. A system comprising:
    a performance monitor circuit comprising:
       first circuitry to participate in a communication which provides to the performance monitor circuit an indication of a format which comprises multiple fields each to store a respective event count;
       second circuitry, coupled to the first circuitry, to program the performance monitor circuit, based on the communication, to:
          designate first bits of a register to provide a first field according to the format; and
          designate second bits of the register to provide a second field according to the format;
       third circuitry, coupled to the second circuitry, to tally, with the register:
          a first count of first events which occur during a first period of time; and
          a second count of second events which occur during a second period of time after the first period of time, wherein the first field and the second field concurrently store the first count and the second count; and
    a display device coupled to the performance monitor circuit, the display device to display an image base on a signal communicated with the performance monitor circuit.

11. The system of claim 10, wherein:
    the first count is tallied with the first field; and
    based on a commencement of the second period of time:
       the first count is shifted from the first field to the second field; and
       the second count is tallied with the first field.

12. The system of claim 11, the third circuitry further to tally, with the register, a third count of third events which occur during a third period of time after the second period of time;
    wherein, based on a commencement of the third period of time:
       the first count is shifted from the second field to a third field of the register;
       the second count is shifted from the first field to the second field; and
       the third count is tallied with the first field.

13. The system of claim 10, wherein the second circuitry to program the performance monitor circuit based on the communication further to determine a value which represents a length of time to tally any of multiple event counts with the register.

14. The system of claim 10, wherein the second circuitry is to program the performance monitor circuit based on the communication to provide, for each of multiple registers, respective fields of the register according to the format.

15. The system of claim 10, wherein the second circuitry to program the performance monitor circuit comprises the second circuitry to set a maximum count to be tallied with one of the first field or the second field.

16. A method comprising:
    participating in a communication which provides to a performance monitor circuit an indication of a format comprising multiple fields each to store a respective event count;
    based on the communication, programming the performance monitor circuit to:
        designate first bits of a register to provide a first field according to the format; and
        designate second bits of the register to provide a second field according to the format;
    with the register, tallying a first count of first events which occur during a first period of time; and
    with the register, tallying a second count of second events which occur during a second period of time after the first period of time, wherein the first field and the second field concurrently store the first count and the second count.

17. The method of claim 16, wherein:
    the first count is tallied with the first field; and
    based on a commencement of the second period of time:
        the first count is shifted from the first field to the second field; and
        the second count is tallied with the first field.

18. The method of claim 17, further comprising:
    with the register, tallying a third count of third events which occur during a third period of time after the second period of time;
    wherein, based on a commencement of the third period of time:
        the first count is shifted from the second field to a third field of the register;
        the second count is shifted from the first field to the second field; and
        the third count is tallied with the first field.

19. The method of claim 16, wherein programming the performance monitor circuit based on the communication is further to determine a value representing a length of time to tally any of multiple event counts with the register.

20. The method of claim 16, wherein programming the performance monitor circuit based on the communication is to provide, for each of multiple registers, respective fields of the register according to the format.

* * * * *